United States Patent
Horng et al.

(10) Patent No.: US 7,808,027 B2
(45) Date of Patent: Oct. 5, 2010

(54) FREE LAYER/CAPPING LAYER FOR HIGH PERFORMANCE MRAM MTJ

(75) Inventors: Cheng T. Horng, San Jose, CA (US); Ru-Ying Tong, Los Gatos, CA (US)

(73) Assignee: MagIC Technologies, Inc., Milpitas, CA (US)

(*) Notice: Subject to any disclaimer, the term of this patent is extended or adjusted under 35 U.S.C. 154(b) by 0 days.

(21) Appl. No.: 12/319,971

(22) Filed: Jan. 14, 2009

(65) Prior Publication Data

US 2010/0176470 A1 Jul. 15, 2010

(51) Int. Cl.
*H01L 29/76* (2006.01)

(52) U.S. Cl. ............... 257/295; 257/E21.665; 257/E29.167; 438/3

(58) Field of Classification Search ........... 257/295, 257/E21.665, E29.167; 438/3
See application file for complete search history.

(56) References Cited

U.S. PATENT DOCUMENTS

| | | | |
|---|---|---|---|
| 6,127,045 A | 10/2000 | Gill | |
| 7,026,673 B2 | 4/2006 | Abraham | |
| 7,211,447 B2 * | 5/2007 | Horng et al. | 438/3 |
| 7,333,306 B2 * | 2/2008 | Zhao et al. | 360/324.12 |
| 7,595,520 B2 * | 9/2009 | Horng et al. | 257/295 |
| 2003/0169542 A1 | 9/2003 | Gill | |
| 2004/0257720 A1 | 12/2004 | Nickel et al. | |
| 2005/0009211 A1 | 1/2005 | Linn et al. | |
| 2005/0254288 A1 | 11/2005 | Fukuzumi | |
| 2005/0276099 A1 | 12/2005 | Horng et al. | |
| 2006/0056114 A1 | 3/2006 | Fukumoto et al. | |
| 2008/0088986 A1 | 4/2008 | Horng et al. | |
| 2008/0113220 A1 | 5/2008 | Sun et al. | |

FOREIGN PATENT DOCUMENTS

WO PCT/US 10/00053 3/2010

* cited by examiner

*Primary Examiner*—Trung Dang
(74) *Attorney, Agent, or Firm*—Saile Ackerman LLC; Stephen B. Ackerman

(57) ABSTRACT

An MTJ MRAM cell and its method of formation are described. The cell includes a composite free layer having the general form $(Ni_{88}Fe_{12})_{1-x}Co_{100x}$—$Ni_{92}Fe_8$ with x between 0.05 and 0.1 that provides low magnetization and negative magnetostriction. The magnetostriction can be tuned to a low value by a multilayer capping layer that includes a positive magnetostriction layer of NiFeHf(15%). When this cell forms an MRAM array, it contributes to a TMR$\geq$26%, a TMR/$R_{p\_cov}\geq$15.5 and a high AQF (array quality factor) for write operations.

29 Claims, 2 Drawing Sheets

US 7,808,027 B2

FREE LAYER/CAPPING LAYER FOR HIGH PERFORMANCE MRAM MTJ

RELATED PATENT APPLICATION

This patent application is related to US Published Patent Application 2008/0088986, Ser. No. 11/582,244, Filing Date Oct. 17, 2006, assigned to the same assignee as the present invention and which is incorporated by reference herein in its entirety.

BACKGROUND OF THE INVENTION

1. Field of the Invention

This invention relates generally to read sensors having an MTJ (magnetic tunneling junction) structure and particularly to the formation and composition of the free layer and capping layers of such sensors.

2. Description of the Related Art

In simplest form, the magnetic tunneling junction, magnetic random access memory cell (MTJ MRAM cell) is formed by patterning a stack of horizontal layers comprising two plane, parallel magnetic layers, separated by an insulating spacer layer of such thinness as to permit the quantum mechanical tunneling of electrons through it. Each magnetic layer in the stack is given a unidirectional magnetic moment within its plane of formation and the relative orientations of the two planar magnetic moments determines an electrical resistance that is experienced by a current that passes from magnetic layer to magnetic layer through the spacer layer (hereinafter referred to as the tunneling barrier layer). The physical basis for the variable resistance (the MTJ effect) is the fact that the current of conduction electrons is spin polarized by its interaction with the magnetic moment of the first of the magnetized layers it passes through. In order for this polarized current to tunnel through the tunneling barrier layer and enter the second of the magnetized layers, the second magnetized layer must have available states in its conduction band to accept the electrons. The availability of such states, in turn, depends on the magnetization direction of the second magnetized layer. The probability of an electron successfully tunneling through the tunneling barrier layer depends on the availability of those states and, therefore, depends on the relative magnetization directions of the layered configuration. In effect, the configuration is a variable resistor that is controlled by the angle between the magnetizations.

In what is called a spin-filter configuration, one of the two magnetic layers in the MTJ cell has its magnetization fixed in spatial direction (the pinned layer), while the other layer (the free layer) has its magnetization free to move in response to an external magnetic stimulus. If the magnetization of the free layer is only permitted to take on two orientations, parallel or antiparallel to that of the pinned layer, then the MTJ cell will have only two resistance values: a high resistance, $R_{ap}$, when the magnetizations are antiparallel and a low resistance, $R_p$, when they are parallel. Thus, these two values can be associated with a logical 1 (high resistance) and a logical 0 (low resistance) and the cell can be used to store information as part of an MRAM device (the device denoting the cell, or array of cells, plus associated circuitry).

The efficacy of the MTJ cell as an information storage device depends on several factors. First, once the cell has been placed in its high or low resistance state, it should be stable until it is placed in an alternative state. Second, since the cell is ultimately part of an array of many cells, their high and low resistance values should be closely comparable to within a fairly rigid set of error bars. In fact, the way a cell is determined to be in its high or low resistance state, is to compare it to a standard cell in the array. If the covariance of the statistical variations of parallel resistances, $R_p$ and antiparallel resistances, $R_{ap}$ among cells, denoted respectively $R_p\_cov$ and $R_{ap}\_cov$, is too great, then the reading of stored logical values will be in error.

The high speed version of MTJ MRAM devices is based on the integration of MTJ devices with silicon based CMOS circuitry. In particular, each MTJ cell is associated with a single CMOS access transistor (1T1MTJ architecture) so that a current can be passed through the cell and the resistance value of the cell can be read. For writing information onto a cell, the magnetization of its free layer must be changed from parallel to antiparallel or vice versa. This change in magnetization direction is accomplished by applying currents to an orthogonal matrix of current carrying lines, wherein one cell is positioned adjacent to a crossing of a pair of lines (a cross point). One of the pair of lines, called the bit line, provides an induced magnetic field that is parallel to the easy axis of the free layer (the axis parallel to the magnetization direction). The other of the pair of lines, called the digit line, provides an induced magnetic field that is along the hard axis direction of the free layer, which is perpendicular to the easy axis direction. When both lines are producing their fields, the resulting field is strong enough to switch the magnetization direction of the free layer.

A figure of merit for an MTJ cell is the TMR ratio, denoted as dR/R, which is actually $(R_{ap}-R_p)/R_p$. In order for an array to have a good read operation margin (a margin of error that insures that comparisons between the individual cells and the standard cell will yield correct assessment of high and low resistance values), the ratio of $TMR/R_p\_cov$ (or $TMR/R_{ap}\_cov$) should be no less than 12, preferably >15 and even more preferably >20. For a good write operation, a high AQF (array quality factor), defined as $H_c/\sigma H_c$, having a value $\geq 20$ is desirable. Here $H_c$ is the mean value of the switching magnetic field and $\sigma H_c$ is the standard deviation of the switching fields across the array. In this regard see D. W. Abraham (U.S. Pat. No. 7,026,673).

Early versions of a 4 Mb MTJ MRAM chip comprised MTJ stacks patterned in an approximate C shape of dimension 0.3×0.6 microns. The stack, denoted as configuration (1) below, illustrated in FIG. 1 and further described in Horng et al. (US Published Pat. Appl. 2008/0088986) which is fully incorporated herein by reference was:

BE/NiCr45/MnPt150/CoFe21/Ru7.5/CoFeB15-
CoFe6/Al8-ROX/Ni(88%)Fe(12%)28-NiFeHf35
(free layer)/Ta 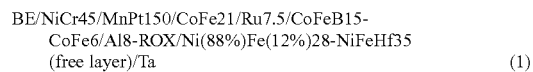 (1)

Where BE (1) is a bottom electrode, NiCr (2) is a seed layer of 45 angstroms thickness, MnPt (3) is an antiferromagnetic pinning layer of 150 angstroms thickness, CoFe (4) is an outer pinned layer of 21 angstroms thickness, Ru (5) is a coupling layer of 7.5 angstroms thickness, CoFeB—CoFe is an inner pinned bilayer (6a), (6b) where the CoFeB is of 15 angstroms thickness and the CoFe is of 6 angstroms thickness so that the (4), (5), (6a)(6b) structure is a synthetic antiferromagnetically pinned layer (SyAP), Al ROX (7) is 8 angstroms of aluminum, oxidized by radical oxidation (ROX) to create an AlOx tunneling barrier layer, Ni(88%)Fe(12%)-NiFeHf (8a) (8b) is a free layer bi-layer in which a first NiFe layer (8a) having Ni with 88% atom percentage and Fe with 12% atom percentage is 28 angstroms in thickness and a second, (Hf doped NiFe) NiFeHf layer is 35 angstroms in thickness and Ta (9) is a capping layer. It is to be noted that the free layer is composed of material of low intrinsic magnetization so that it must be made thick. This added thickness reduces the statistical variation in magnetic switching thresholds, $\sigma H_c$, thereby producing a high value of AQF>20. This particular technology is implemented in the (1T2MTJ) configuration where two MTJ cells are associated with a single access transistor and the free layers of the two MTJ elements are oppositely aligned. For reference purposes, the product of cross-sectional area and resistance, RA is approximately 1000 ohm-$\mu m^2$ and intrinsic TMR is about 45%. The low magnetization free layer allows a very low magnetostriction to be obtained (X, approx. $2$-$5\times10^{-7}$). For this product, mean TMR at device read operation (with 300 mV bias) is approximately 25% and mean $R_{p\_}$cov is approx. 1.5%, yielding a read margin of TMR/$R_{p\_}$cov of approx. 16. For the oval shaped cell $R_{p\_}$cov is about 1.2%. so the read margin is greater than 20.

Using smaller design/process technologies, a 16 Mb MTJ MRAM is now being fabricated in which the cell size is on the order of $0.2\times0.4$ $\mu m$ and is C-shaped in cross-section. Initially, the stack configuration of (1) was used. With that configuration, mean $R_{p\_}$cov is increased to 1.7% and mean TMR at 300 mV bias is decreased slightly to 22-23%. Therefore, the read margin becomes approximately 13, which is too marginal for production purposes. For production quality 16 Mb MTJ MRAM, it is necessary to improve TMR in order to improve the device read margin. This will require an MTJ cell with an intrinsic TMR$\geq$50%.

SUMMARY OF THE INVENTION

It is an object of this invention is to provide a MTJ cell and its method of formation that combines a high TMR ratio and a high device read margin.

It is a further object of this invention to provide such a cell that is suitable for use in high density MRAM arrays, such as 16 Mb MRAM arrays.

It is yet a further object of this invention to provide such a cell in which a free layer can be tuned to a low value of magnetostriction.

It is yet a further object of this invention to provide such a cell in which a TMR is enhanced by improving the amount of spin polarization provided by the magnetic layers.

It is yet a further object of this invention to provide such a cell in which write operations, as measured by the array quality factor (AQF), is greater than or equal to approximately 20.

These objects will be met by means of an MTJ cell stack formation of the following configuration, denoted configuration (2):

BE/NiCr45/MnPt150/CoFe21/Ru7.5/CoFeB15-
CoFe6/Al8-ROX/(free layer)/NiFeHf(t)/Ta30/
Ru100  (2)

Referring to FIG. 2, there is shown the layered construction of the stack described above as configuration (2). As illustrated in FIG. 2, BE (1) is a bottom electrode, NiCr (2) is a seed layer of 45 angstroms thickness, MnPt (3) is an antiferromagnetic pinning layer of 150 angstroms thickness, CoFe (4) is an outer pinned layer of 21 angstroms thickness, Ru (5) is a coupling layer of 7.5 angstroms thickness, CoFeB-CoFe is an inner pinned bilayer (6a), (6b) where the CoFeB is of 15 angstroms thickness and the CoFe is of 6 angstroms thickness so that the (4), (5), (6a)(6b) structure is a synthetic antiferromagnetically pinned layer (SyAP), Al ROX (7) is 8 angstroms of aluminum, oxidized by radical oxidation (ROX) to create an AlOx tunneling barrier layer, a free layer (8a) (8b), preferably formed as a composite multilayer each layer of which is an alloy of Fe, Ni and Co and whose possible composite structures and preferred embodiments will be discussed below in Table 2, is formed on the AlOx tunneling barrier layer, an Hf doped NiFe capping layer, NiFeHf (9), of thickness (t) is formed on the free layer and, finally, the structure is further capped with a bilayer formed as a Ta (10) layer of 30 angstroms thickness on which is formed a Ru layer (11) of 100 angstroms thickness. It is noted that all thicknesses in the stack formation are to be considered as approximate.

First, three free layer compositions were studied by incorporating each of them within the stack formation of configuration (2). The layer compositions and their thicknesses were as follows: 1. $Ni_{88}Fe_{12}$ (28 angstroms); 2. $Ni_{84}Fe_{11}Co_5$ (28 angstroms) and 3. $Ni_{84}Fe_{11}Co_5$ (25 angstroms). Each of these layers was capped with NiFeHf(15%) of thicknesses 40 angstroms, 40 angstroms and 50 angstroms, respectively. The stacks were annealed at 265° C., in an external 10 K Oe magnetic field for 5 hours and various measurements were then performed, including areal resistance, RA in ohm-micron$^2$, free layer coercivity $H_c$, film anisotropy, $H_k$ and coefficient of magnetostriction $\lambda$. Note that saturation magnetic field, $B_s$, was approximately 0.6 nano-Webers (through choice of the layer dimensions) in all these experiments, so it is not indicated as a variable in the following tables. The results of these measurements are given in Table 1 below.

TABLE 1

| Free Layer | NiFeHf thickness | RA | MR | $H_k$ | $H_c$ | $\lambda$ |
|---|---|---|---|---|---|---|
| $Ni_{88}Fe_{12}$ 28 ang | 40 Ang. | 667 | 45 | 12.0 | 4.9 | 3.0E–07 |
| $Ni_{84}Fe_{11}Co_5$ 28 ang | 40 Ang. | 600 | 46.3 | 18.7 | 4.8 | –4.3E–07 |
| $Ni_{84}Fe_{11}Co_5$ 25 ang | 50 Ang. | 641 | 49.1 | 18.2 | 4.4 | 1.1E–06 |

From the disadvantageous physical properties of these free layers, particularly high magnetostriction (leading to the need of high switching fields), high $H_k$ and low MR, it was decided to investigate additional free layer compositions until a set of properties consistent with the objects of the invention were obtained. It is noted that free layers formed of alloys of Ni, Fe and Co have been described by Nickel et al (US Pub. Pat. Appl., 2004/0257720) and Fukumoto et al. (US Pub. Pat. Appl. 2006/0056114). However these inventions do not provide the desirable and advantageous properties of the free layers to be described below that form the preferred embodiments of the present invention.

DESCRIPTION OF THE PREFERRED EMBODIMENTS

Figure 1:
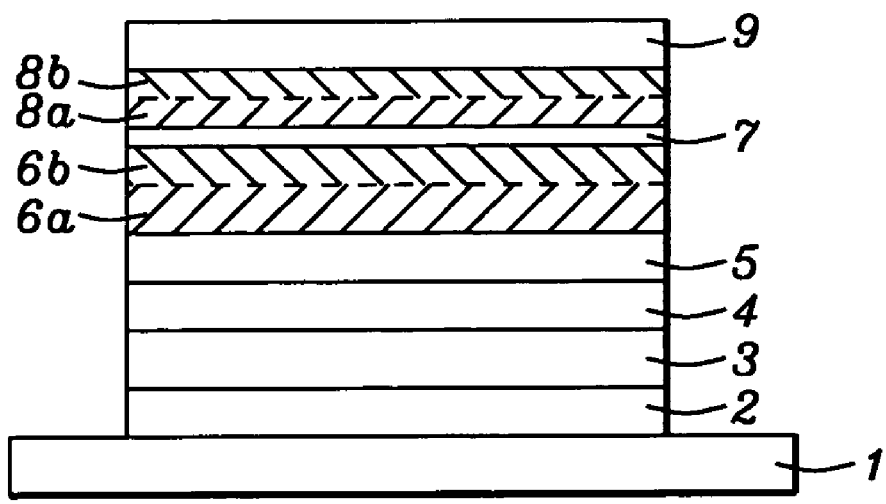
FIG. 1 is an illustration of a Prior Art MTJ stack
Figure 2:
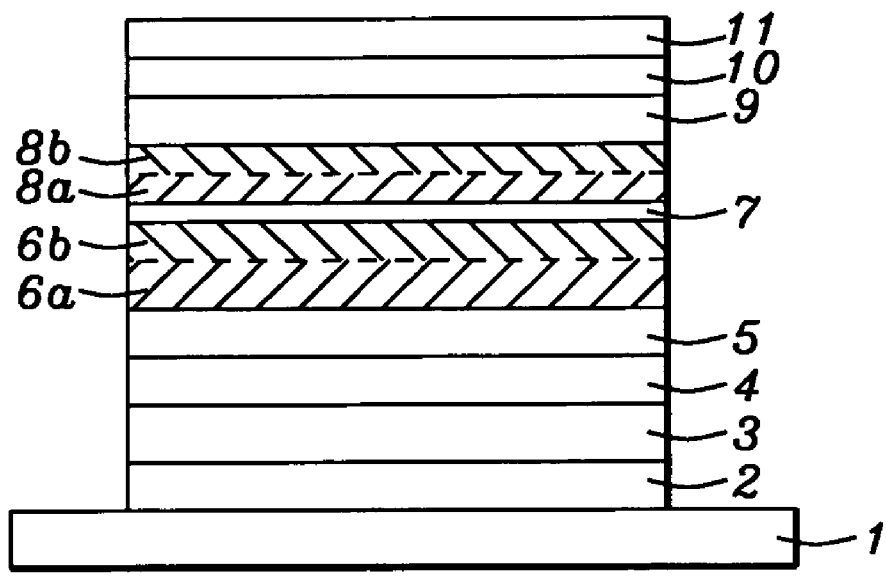
FIG. 2 is an illustration of a stack of the present invention.

The preferred embodiment of the present invention is an MTJ cell and an MRAM array of such cells, having the stack of configuration (2) above and as shown in FIG. 2, wherein a cell free layer is formed as a specific alloy of Ni, Fe and Co, preferably a composite layer formed as a layer of $(Ni_{88}Fe_{12})_{1-x}Co_{100x}$, where x is between 0.05 and 0.1, and having a thickness denoted as $t_1$, upon which is formed a layer of $Ni_{92}Fe_8$, having a thickness denoted as $t_2$. The results in Table 1 already indicate that properties of the free layers described therein were not sufficient to meet the desired objects of the 16 Mb MRAM arrays.

Figure 3:
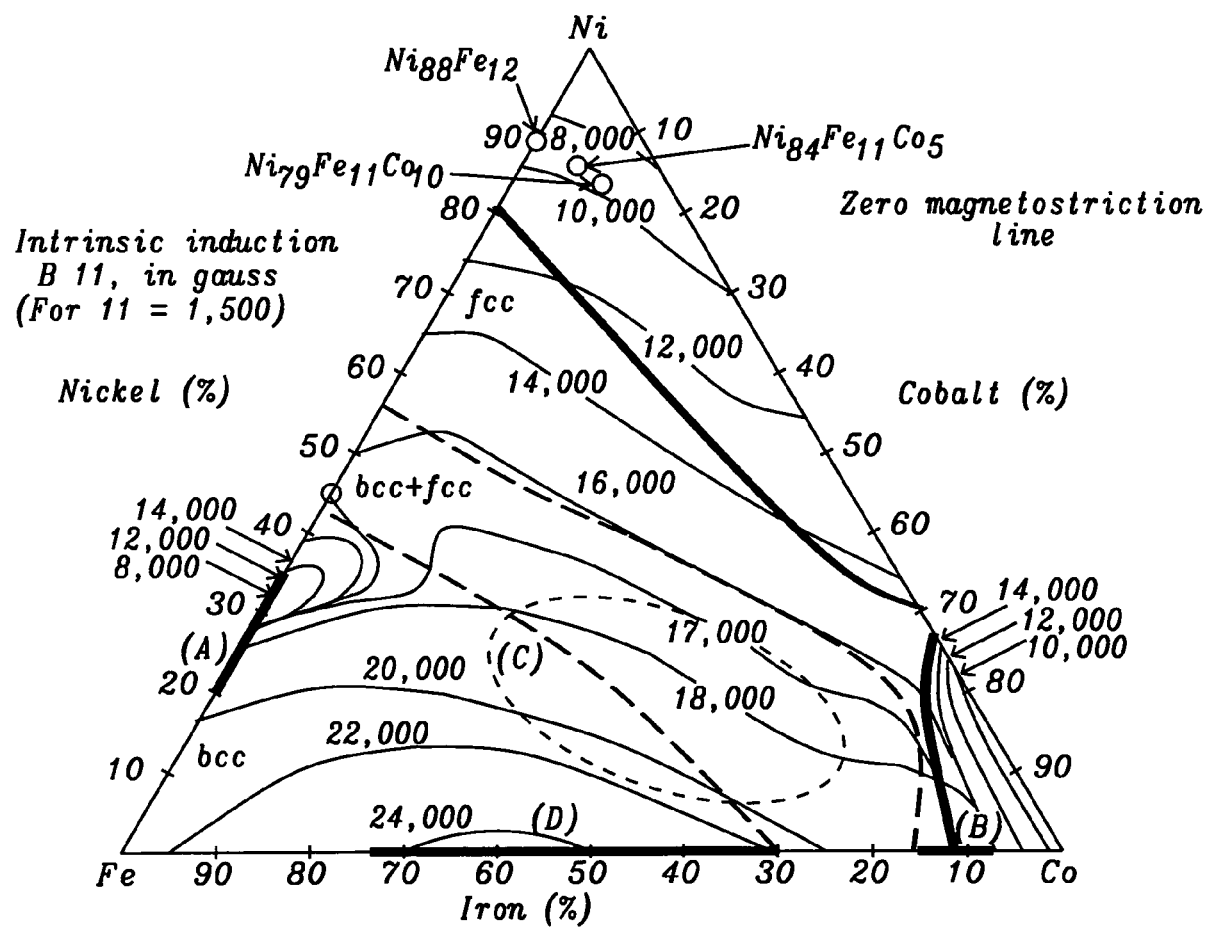
FIG. 3 is a phase diagram showing the magnetic properties of Ni—Fe—Co alloys.

The preferred composite free layer described above provides the MTJ cell of the present invention with the properties that meet the stated objects. Referring to FIG. 3, there is shown a phase diagram indicating physical properties of bulk Ni—Fe—Co alloys according to relative atom percentages of the three elements. It is to be noted that generally, adding Co to an NiFe alloy will improve the free layer polarization properties, thereby improving TMR. It is also known that adding Co to a NiFe alloy will tune the magnetostriction toward the negative side. For example, three dots in the diagram show the positions of the alloys $Ni_{88}Fe_{12}$, $Ni_{84}Fe_{11}Co_5$ and $Ni_{79}Fe_{11}Co_{10}$ relative to the zero magnetostriction line. It can be seen that $Ni_{88}Fe_{12}$, which was used in the 4 Mb MRAM technology, has negative magnetostriction and both $Ni_{84}Fe_{11}Co_5$ and $Ni_{79}Fe_{11}Co_{10}$ have magnetostriction that is even more negative. Note, therefore, that the thicker layer of $Ni_{84}Fe_{11}Co_5$ in row 2 of Table 1 has tuned the magnetostriction of the stack to a negative value. However, as shown in FIG. 3, the saturation magnetization, $B_s$ for $Ni_{84}Fe_{11}Co_5$ and $Ni_{79}Fe_{11}Co_{10}$ is still lower than $Ni_{80}Fe_{20}$, which shows zero magnetostriction.

To cope with the various deficiencies of the three exemplary free layers in Table 1 and to take advantage of the alloy magnetic properties shown in FIG. 3, it was decided to investigate the properties of composite free layers. As noted above, these layers are formed within the exemplary stack labeled as configuration (2) above.

Table 2 (below) shows the properties of such composite layers, with the exception of the first row which is the reference layer of the previous 4 Mb process.

TABLE 2

| Free layers Thicknesses in angstroms | NiFeHf(t) | RA | MR | $H_k$ | $H_c$ | $\lambda$ |
|---|---|---|---|---|---|---|
| $Ni_{88}Fe_{12}$ 28 Reference | 40 | 667 | 45 | 12.0 | 4.9 | 3.0E−07 |
| $Ni_{84}Fe_{11}Co_5$ 10-$Ni_{92}Fe_8$ 16 | 50 | 745 | 46.7 | 14.2 | 5.6 | −1.3E−06 |
| $Ni_{84}Fe_{11}Co_5$ 10-$Ni_{92}Fe_8$ 16 | 60 | 768 | 48.7 | 14.4 | 5.3 | −2.1E−08 |
| $Ni_{84}Fe_{11}Co_5$ 12-$Ni_{92}Fe_8$ 14 | 50 | 743 | 49.1 | 14.8 | 5.7 | −7.1E−07 |
| $Ni_{84}Fe_{11}Co_5$ 12-$Ni_{92}Fe_8$ 14 | 60 | 776 | 51.5 | 14.9 | 5.6 | 2.0E−08 |

Referring to Table 2, there is shown the properties of two composite free layer configurations that were studied to see if high values of magnetostriction could be reduced. $Ni_{84}Fe_{11}Co_5$ 10-$Ni_{92}Fe_8$ 16 and $Ni_{84}Fe_{11}Co_5$ 12-$Ni_{92}Fe_8$ 14 are two composite free layers that differ in the thickness of each layer in the composite. The extra layer of $Ni_{92}Fe_8$ is chosen because it has a more negative magnetostriction than $Ni_{88}Fe_{12}$, which is a reference layer chosen for comparison purposes because it is the structure previously used in the 4 Mb MRAM architecture. The two composite free layers are formed within the stack configuration (2) shown in FIG. 2 and the additional capping layer NiFeHf, which has a positive magnetostriction, is formed in two thicknesses, 50 and 60 angstroms. It is to be noted that this additional thickness of the NiFeHf layer as compared to the 39 angstrom thickness of the same layer in the previous configuration (1) is responsible for further increasing the TMR ratio of the present invention. It also tunes the magnetostriction of the stack (with the negative magnetostriction composite free layers) towards a low value of magnetostriction. The stacks were treated with a 5 hour, 265° C. annealing process in an external field of 10 kOe. Magnetic properties were measured using tools that are standard in the art.

As can be seen from the results in the last row in Table 2, as compared to the value of $H_k$ of 18.2 shown in Table 1 for the single layer of $Ni_{84}Fe_{11}Co_5$, the value of $H_k$ for the composite layer that also includes the layer of $Ni_{92}Fe_8$ has been reduced to 14.9. Note also that the magnetostriction is in an advantageous low positive range of $2 \times 10^{-8}$. In addition, the value of MR (TMR ratio) for the composite layer has been increased to 51.5 from the value of 49.1 for the single $Ni_{84}Fe_{11}Co_5$ layer. Comparison to the reference layer in Table 1 shows an even greater improvement in MR. Further calculations indicate that the read margin would be improved to 15.8 for the 16 Mb application, which is quite acceptable.

The stack described in the last row of Table 2 could be appropriately patterned, preferably in a C-shape, with dimensions approximately 0.2×0.4 microns, then integrated within the back end of a CMOS process, utilizing, for example, a (1T1MRAM) or a (1T2MRAM) configuration. The stack comprising the exemplary preferred composite free layer $Ni_{84}Fe_{11}Co_5$ 12-$Ni_{92}Fe_8$ 14, with the addition of the thicker positive magnetostriction capping layer NiFeHf formed to a thickness of approximately 60 angstroms and the additional capping layers Ta30/Ru100 formed over the NiFeHf, will provide the following desirable performance characteristics of the MRAM array formed using a cell patterned from that stack:

1. Enhanced TMR ratio due to the improved spin polarization properties of the composite free layer, particularly the Co component.

2. Tuned to a low value of magnetostriction.

3. Further enhancement of the TMR ratio to values above 50% due to the thicker (60 angstroms thickness) positive magnetostriction NiFeHf layer, which also reduces $H_k$.

4. TMR≧26% for the 0.3 V biased MRAM devices in 0.2×0.4 micron C-shape patterning, yielding a TMR/$R_p$ cov≧15.5 for proper circuit operation of the 16 Mb MRAM technology.

5. Use of low magnetization materials such as $(Ni_{88}Fe_{12})_{1-x}Co_{100x}$ with x between 0.05 and 0.1 in the free layer together with the layer of NiFeHf, produces a greatly improved AQF for the write process.

In addition, as can be inferred from FIG. 3, a composite free layer that includes a layer of $Ni_{79}Fe_{11}Co_{10}$ should provide further enhanced spin polarization properties, thereby producing an even higher TMR ratio and a resulting higher read margin.

It is also to be noted that the 16 Mb MRAM has been made, and for MTJ structures with the $Ni_{84}Fe_{11}Co_5$—$Ni_{92}Fe_8$ free layer, capped with NiFeHf 55, dR/R at a 300 mV bias is between approximately 24-25%. This is to be compared with a $Ni_{88}Fe_{12}$/NiFeHf 40 structure, for which dR/R is approximately 22%. In addition, the $Ni_{84}Fe_{11}Co_5$ structure shows performance properties which are generally better.

As is understood by a person skilled in the art, the preferred embodiments of the present invention are illustrative of the present invention rather than limiting of the present invention. Revisions and modifications may be made to methods, materials, structures and dimensions employed in forming and providing an MTJ MRAM cell with a composite free layer, while still forming and providing such a device and its method of formation in accord with the spirit and scope of the present invention as defined by the appended claims.

What is claimed is:

1. An MTJ MRAM cell element comprising:
   a seed layer;
   a pinning layer formed on said seed layer;
   a pinned layer formed on said pinning layer;
   a tunneling barrier layer formed on said pinned layer;
   a composite free layer formed on said tunneling barrier layer, said free layer being formed as a multilayer of materials having low magnetization and having negative magnetostriction; and whereby the magnetostriction of said cell can be tuned to a low value by a multilayered capping layer having positive magnetostriction; and
   said multilayered capping layer formed on said free layer.

2. The cell element of claim 1 wherein said composite free layer includes a first layer of the compositional form $(Ni_{88}Fe_{12})_{1-x}Co_{100x}$ where x is between approximately 0.05 and 0.1.

3. The cell element of claim 2 wherein said first layer is formed to a thickness between approximately 8 angstroms and 14 angstroms.

4. The cell element of claim 2 wherein said composite free layer has a negative magnetostriction.

5. The cell element of claim 2 wherein a second layer of $Ni_{92}Fe_8$ is formed on said first layer.

6. The cell element of claim 5 wherein said second layer of $Ni_{92}Fe_8$ is formed to a thickness of between approximately 14 and 16 angstroms.

7. The cell element of claim 6, whereby said composite free layer has a negative magnetostriction.

8. The cell element of claim 1 wherein said composite free layer is a layer of $Ni_{84}Fe_{11}Co_5$ $(t_1)$-$Ni_{92}Fe_8$ $(t_2)$, wherein $t_1$ is a thickness between approximately 10 angstroms and 14 angstroms and $t_2$ is a thickness between approximately 14 angstroms and 16 angstroms.

9. The cell element of claim 1 wherein said composite free layer is a layer of $Ni_{79}Fe_{11}Co_{10}$ $(t_1)$-$Ni_{92}Fe_8$ $(t_2)$, wherein $t_1$ is a thickness between approximately 8 angstroms and 12 angstroms and $t_2$ is a thickness between approximately 14 angstroms and 16 angstroms.

10. The cell element of claim 1 wherein said multi-layered capping layer includes a positive magnetostriction layer of NiFeHf(15%), with 15% of Hf atoms, formed contacting said composite free layer.

11. The cell element of claim 10 wherein said positive magnetostriction layer of NiFeHf(15%) is formed to a thickness between approximately 40 and 60 angstroms.

12. The cell element of claim 11 wherein said cell element has a TMR ratio that is greater than or equal to 50%.

13. The cell element of claim 10 wherein said multi-layered capping layer includes a layer of Ta formed contacting said positive magnetostriction layer of NiFeHf(15%) and a layer of Ru contacting said layer of Ta and wherein said layer of Ta is approximately 30 angstroms in thickness and said layer of Ru is approximately 100 angstroms in thickness.

14. The cell element of claim 1 wherein said pinned layer is a synthetic antiferromagnetic layer comprising an inner and outer ferromagnetic layer coupled by a layer of Ru in a configuration of antiparallel magnetic moments and wherein said outer layer is a layer of CoFe and said inner layer is a composite layer of CoFeB and CoFe.

15. The cell element of claim 1 wherein said tunneling barrier layer is a layer of Al of approximate thickness 7.75 angstroms that has been oxidized by a process of radical oxidation to form a layer of AlOx.

16. The cell element of claim 1 further including a cross-sectional patterning in a C-shape and having dimensions of approximately 0.2×0.4 microns.

17. A method of forming an MTJ MRAM cell element comprising:
   providing a substrate;
   forming a seed layer on the substrate;
   forming a pinning layer on said seed layer;
   forming a pinned layer on said pinning layer;
   forming a tunneling barrier layer on said pinned layer;
   forming on said tunneling barrier layer a composite free layer as a multi-layer of materials having low magnetization and having negative magnetostriction, whereby the magnetostriction of said cell can be tuned to a low value by the formation of a multilayered capping layer thereon;
   forming said multi-layered capping layer on said free layer; then
   annealing said formation in a 10 kOe magnetic field, at approximately 265° C. for approximately 5 hours.

18. The method of claim 17 wherein the formation of said composite free layer comprises forming on said tunneling barrier layer a first layer of the compositional form $(Ni_{88}Fe_{12})_{1-x}Co_{100x}$ where x is between approximately 0.05 and 0.1.

19. The method of claim 18 wherein said first layer is formed to a thickness between approximately 8 angstroms and 14 angstroms.

20. The method of claim 18 wherein a second layer, formed of $Ni_{92}Fe_8$, is formed on said first layer.

21. The method of claim 20 wherein said second layer of $Ni_{92}Fe_8$ is formed to a thickness of between approximately 14 and 16 angstroms.

22. The method of claim 17 wherein said composite free layer is formed as a layer of $Ni_{84}Fe_{11}Co_5$ $(t_1)$ on which is formed layer of $Ni_{92}Fe_8$ $(t_2)$, wherein $t_1$ is a thickness between approximately 10 angstroms and 14 angstroms and $t_2$ is a thickness between approximately 14 angstroms and 16 angstroms.

23. The method of claim 16 wherein said composite free layer is formed as a layer of $Ni_{79}Fe_{11}Co_{10}$ $(t_1)$ on which is formed a layer of $Ni_{92}Fe_8$ $(t_2)$, wherein $t_1$ is a thickness between approximately 8 angstroms and 12 angstroms and $t_2$ is a thickness between approximately 14 angstroms and 16 angstroms.

24. The method of claim 16 wherein said multi-layered capping layer is formed by first forming, contacting said composite free layer, a positive magnetostriction layer of NiFeHf(15%), with 15% of Hf atoms.

25. The method of claim 24 wherein said positive magnetostriction layer of NiFeHf(15%) is formed to a thickness between approximately 40 and 60 angstroms.

26. The method of claim 24 wherein a layer of Ta is formed contacting said layer of NiFeHf(15%) and a layer of Ru is then formed contacting said layer of Ta and wherein said layer of Ta is approximately 30 angstroms in thickness and said layer of Ru is approximately 100 angstroms in thickness.

27. The method of claim 17 wherein said pinned layer is formed as a synthetic antiferromagnetic layer comprising an inner and outer ferromagnetic layer coupled by a layer of Ru to create a configuration of antiparallel magnetic moments subsequent to said annealing process and wherein said outer layer is a layer of CoFe and said inner layer is a composite layer of CoFeB and CoFe.

28. The method of claim 17 wherein said tunneling barrier layer is formed as a deposited layer of Al of approximate thickness 7.75 angstroms that is then oxidized by a process of radical oxidation to form a layer of AlOx.

29. The method of claim 17 further including a cross-sectional patterning in a C-shape and having dimensions of approximately 0.2×0.4 microns.

* * * * *